(12) United States Patent
Nallabelli et al.

(10) Patent No.: US 9,069,047 B2
(45) Date of Patent: Jun. 30, 2015

(54) TALKING POWER MANAGEMENT UTILITY

(71) Applicants: Madhu Nallabelli, Troy, MI (US); Dean Figlioli, Royal Oak, MI (US)

(72) Inventors: Madhu Nallabelli, Troy, MI (US); Dean Figlioli, Royal Oak, MI (US)

(*) Notice: Subject to any disclaimer, the term of this patent is extended or adjusted under 35 U.S.C. 154(b) by 0 days.

(21) Appl. No.: 14/305,307

(22) Filed: Jun. 16, 2014

(65) Prior Publication Data

US 2014/0292524 A1 Oct. 2, 2014

Related U.S. Application Data

(63) Continuation-in-part of application No. 13/438,060, filed on Apr. 3, 2012.

(60) Provisional application No. 61/473,297, filed on Apr. 8, 2011.

(51) Int. Cl.
*G08B 21/00* (2006.01)
*G08B 5/22* (2006.01)
*H04M 1/00* (2006.01)
*H02J 7/00* (2006.01)
*G01R 31/36* (2006.01)
*H01M 10/42* (2006.01)
*H04W 52/02* (2009.01)

(52) U.S. Cl.
CPC ..... *G01R 31/3689* (2013.01); *H02J 2007/0098* (2013.01); *H01M 10/4257* (2013.01); *H02J 7/0047* (2013.01); *H04W 52/0277* (2013.01); *H02J 2007/005* (2013.01)

(58) Field of Classification Search
CPC . H02J 2007/005; H02J 7/0047; H02J 7/0068; H02J 2007/0098; H02J 7/0021; H02J 2007/0067; H02J 9/002; H02J 2007/0001; H02J 7/0004; H04W 52/0277; H04W 52/0261; H04W 68/005; G01R 31/3689; G01R 31/3686; G01R 31/3606; H04L 51/24; H01M 10/48; H01M 10/4257; H04M 1/0262; G06F 1/3212; Y02B 60/1292
USPC ............. 340/636.1, 636, 825.44, 311.1, 663, 340/6.1, 335, 336.1, 636.13, 636.19, 7.32, 340/7.37, 455; 320/106, 132, 6, 48, 39, 320/127, 136, 107, 114, 134, 118, 160, 124, 320/137; 455/569.2, 343, 404.1, 574, 455/343.2, 343.6, 550.1, 572, 573, 343.1, 455/343.5; 307/10.7
See application file for complete search history.

(56) References Cited

U.S. PATENT DOCUMENTS 5,963,012 A * 10/1999 Garcia et al. .................. 320/106
6,160,490 A * 12/2000 Pace et al. .................... 340/7.37
(Continued)

*Primary Examiner* — Mirza Alam
(74) *Attorney, Agent, or Firm* — Buckingham, Doolittle & Burroughs, LLC

(57) ABSTRACT

An architecture is presented that provides a computer-implemented system and method for monitoring a remaining battery charge level in a mobile computer cart used in a hospital environment and detecting when said battery charge level is reduced to a selected level. The system comprises a monitoring component that monitors remaining battery charge levels for the mobile computer cart. Further, the monitoring component communicates with a detection component which detects when the battery charge levels of the mobile computer cart are low and/or reach a predetermined threshold level. The system further comprises a trigger component that sends a customizable alert to a user once a low battery charge level and/or a predetermined threshold level has been reached. Furthermore, the system comprises a power component that automatically places the mobile computer cart in detect and protect mode after a predetermined period of time after the alerts are sent.

15 Claims, 8 Drawing Sheets

(56) References Cited

U.S. PATENT DOCUMENTS

| | | | |
|---|---|---|---|
| 2005/0058268 A1* | 3/2005 | Koch | 379/207.16 |
| 2005/0260970 A1* | 11/2005 | Losquin et al. | 455/343.5 |
| 2007/0096691 A1* | 5/2007 | Duncan et al. | 320/114 |
| 2007/0205745 A1* | 9/2007 | Chen et al. | 320/136 |
| 2008/0206627 A1* | 8/2008 | Wright | 429/93 |
| 2010/0052930 A1* | 3/2010 | Grigsby et al. | 340/663 |
| 2011/0009710 A1* | 1/2011 | Kroeger et al. | 600/300 |

* cited by examiner

TALKING POWER MANAGEMENT UTILITY

CROSS-REFERENCE

This application is a continuation-in-part of Utility patent application Ser. No. 13/438,060 filed Apr. 3, 2012, and claims priority from Provisional Patent Application Ser. No. 61/473,297 filed Apr. 8, 2011.

BACKGROUND

Hospital/Clinical staff (e.g., Doctors, Nurses, Phlebotomists and other medical practitioners) currently rely heavily on Mobile Medical Carts. These hospital based Mobile Medical Carts are wheeled computer carts with a laptop powered by an expensive re-chargeable battery, a charger, an inverter (to convert DC voltage to AC voltage) and other accessories such as an external monitor, a barcode scanner, a vital signs meter, a barcode printer, a medication cabinet with electronic locking mechanism and other such devices. All of these electronic devices (or equipment) draw a large amount of power from the battery causing the cart to be recharged frequently. Hospital staff move these carts from one patient room to another to access and update patient information, dispense medication, check vital signs and update patient records following EMR (Electronic Medical Records) standards on a daily/hourly basis, and reliance on the Mobile Computer Carts is expected to continue to grow in the future. The expensive batteries used in these Mobile Computer Carts, as their source of primary power, are usually Lithium-ion, Lithium-Phosphate, Lithium Iron Magnesium Phosphate and many other types. Thus, the field of power management with respect to the batteries is becoming increasingly important. Currently, hospitals are moving towards a more electronic methodology as it relates to servicing their patients. However, these same hospitals are struggling with the required power management needed for these electronic tools.

Current power management tools directed at alerting a user of a depleted battery tend to irritate users with loud buzzers and/or alarms. These loud buzzers and/or alarms are simply muted, unplugged, and/or ignored while the mobile cart is left unattended and depleted due to busy hospital staff duties. Thus, the battery of the electronic devices on the mobile cart remains uncharged, and continues to deplete. Typically, when the battery of the hospital mobile cart completely runs out, the device goes into a non-functional mode and all patient information, patient charts, medication administered, very critical time based vital signs (e.g., Blood pressure, Heart Rate, Blood Glucose) are interrupted and not entered into the EMR database on the server violating all industry EMR standard requirements. Alternatively, Hospital staff will note the information on a piece of paper and many times forget to enter the information into the EMR database when power is restored resulting in misdiagnosis of the patent by the doctor and which may sometimes result in heavy lawsuits. Consequently, the battery for the device must be charged for a period of time before the device can be used. Furthermore, allowing the battery of an electronic device to deplete completely on a repeated basis tends to shorten the life of the battery, and typically causes the need to replace the battery. These types of issues impact the number of tools needed to service the patients and can increase the risk of security and possible loss of revenue. Consequently, an effective solution is necessary.

Further, in the document entitled "New Joint Commission alert addresses medical device alarm safety in hospitals" and its addendum (www.jointcommission.org), the author reports the constant beeping of alarms and an overabundance of information transmitted by medical devices such as ventilators, blood pressure monitors and ECG machines is creating "alarm fatigue" that puts hospital patients at serious risk. The Joint Commission Alert urges leaders at hospitals to take a focused look at this serious patient safety issue.

Additionally, in the document entitled "Sounding the Alarm on . . . well . . . Alarms" (Healthcare Journal of Baton Rouge www.healthcarejournalbr.com), the author reports that in areas that care for the critically ill, it can seem that alarms are sounding constantly. However, the sheer number of alarms, sometimes hundreds per patient, per day, can not only be mentally distracting, but can also make it impossible to hear some alarms, lead to burnout responding to alarms, or cause desensitization to alarms, a condition known as "alarm fatigue." Customization of alarms can go a long way towards reducing meaningless alarms, false positives, and unnecessary noise.

Thus, there is a need for an improved alerting system and method for monitoring remaining battery charge levels and detecting when battery charge levels are low. Today hospital staff can be confused between all kinds of medical devices that send alerts by beeping, but the staff doesn't know what the "beep" means. So, a customized alerting solution that does not beep, but provides soothing human voice alerts explaining the reason for the alert, is in need. One aim of the present invention is to provide a system and method for monitoring battery charge levels and a method for customizing alarms. Specifically, the present invention discloses a Talking Power Management Utility (TPMU) program for monitoring remaining battery charge levels and placing the device in a detect and protect mode when the device's remaining battery charge level is low. The TPMU program instructs the mobile computer cart with a depleted battery to enter into a proprietary detect and protect mode, effectively elongating the life of the battery and reducing cost for replacement. This hardware and software solution also detects the battery charge levels and alerts the user proactively with a soothing alert that is customizable by a user and comprises computer generated human voice messages accompanied by visual characters and/or video animations; and wherein the battery charge level for the device is monitored for a past period of time with an intelligent proprietary algorithm to determine if a battery is strong or weak and the selected level is updated based on this determination. These alerts can be applied to any electronic device that requires power management and will work in conjunction with any type of battery. This product is ideal for use in administrative and medical/hospital businesses in mobile computer carts that require power management. The TPMU program provides users with an efficient device and method for monitoring remaining battery charge levels and detecting when battery charge levels are dangerously low.

SUMMARY

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented later.

The subject matter disclosed and claimed herein, in one aspect thereof, comprises a computer-implemented system and method for monitoring remaining battery charge levels and detecting when battery charge levels are low. The system comprises a monitoring component that monitors remaining battery charge levels for a mobile computer cart that requires power management. The monitoring component can monitor all types of batteries as is known in the art. Further, the monitoring component communicates with a detection component. The detection component detects when the battery charge levels of the mobile computer carts are low and/or reach a predetermined threshold level. The system further comprises a trigger component that sends an alert to a user once the low battery charge level and/or a predetermined threshold level has been reached. The alert is customizable by a user, and alerts the user proactively with a computer-generated human voice message which includes visual and animated characters.

Furthermore in the preferred embodiment of the present invention, the system comprises a power component that automatically places the mobile computer cart in detect and protect mode after a predetermined period of time after the alerts are sent to a user or when the mobile computer cart is not in use. In this mode, the mobile computer cart is put into a detect and protect mode which causes the battery to trickle drain and the mobile computer cart (and its devices) can be brought back to active status with the user's input, thus extending battery life. Additionally, the monitoring component and the detection component of the system comprise a software program and/or hardware to enable the components to recognize all batteries from various devices on the mobile computer cart requiring power management, to monitor and detect the battery charge level on these devices, and to alert a user of these battery charge levels via audio/video message alerts. Further, the software includes a software plugin that collects data from non-standard inverters that do not use WMI technology. This software plugin can be customized to read and understand various data formats supplied by different inverter manufacturers. Further, the system can comprise a console device (or dashboard) that displays the status of multiple mobile computer carts. The console device is viewed and monitored in a central location which can be separate from where the mobile computer carts are located.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

DESCRIPTION OF PREFERRED EMBODIMENTS

Figure 1:
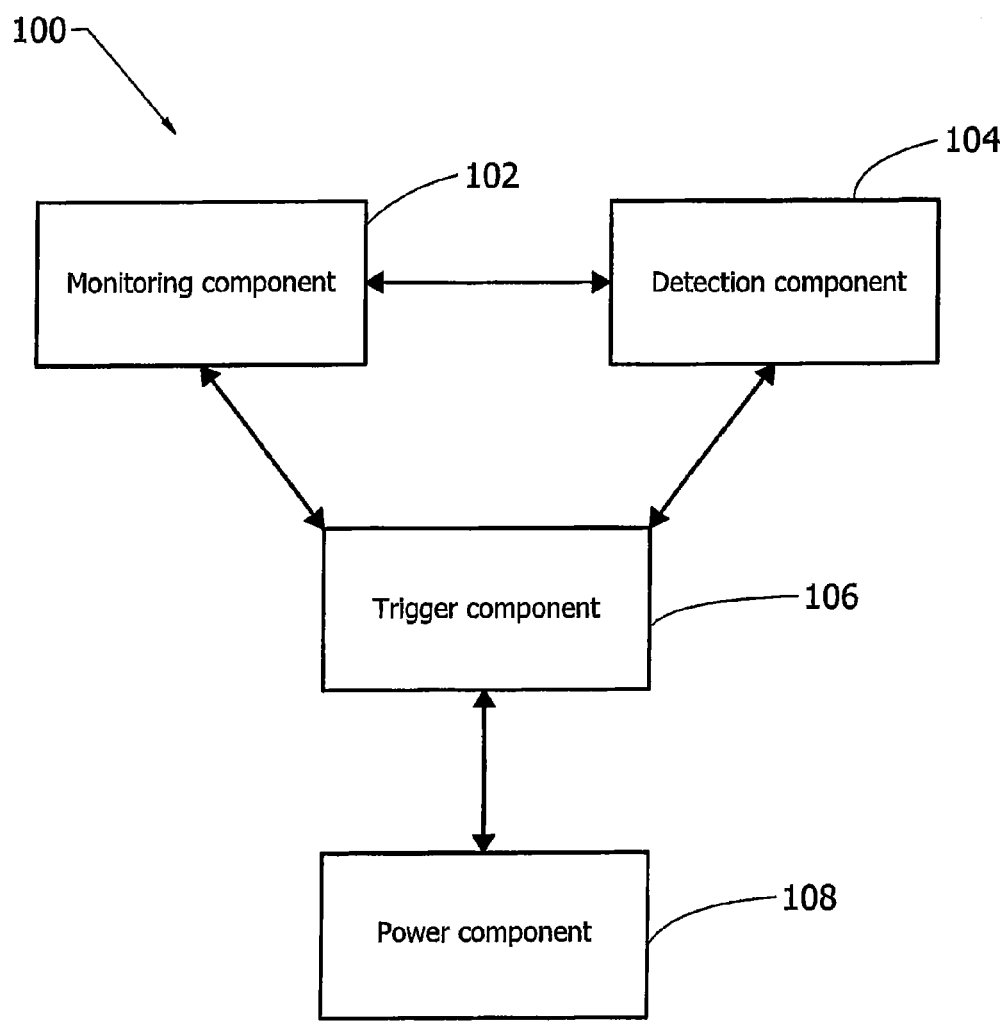
FIG. 1 illustrates a computer-implemented system for monitoring remaining battery charge levels and detecting when battery charge levels are low in accordance with the disclosed architecture.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof.

Currently, mobile computer carts are used in multiple departments, such as patient areas, pathology, radiology, emergency rooms etc. These mobile computer carts are expensive and require a user to plug in the cart to recharge the batteries, if this does not happen, the cart will eventually shut down and the help desk needs to be called to dispatch field engineers to reactivate the cart after the cart is plugged in which could become expensive as a typical hospital may have several hundred to several thousand carts that shutdown on daily basis.

The present invention discloses a Talking Power Management Utility (TPMU) program for monitoring remaining battery charge levels and placing a device in detect and protect mode when the device's remaining battery charge level is low. The TPMU program instructs the mobile computer cart with a depleted battery to enter into the proprietary detect and protect mode, effectively elongating the life of the battery and reducing cost for replacement. This hardware and/or software solution also detects the battery charge levels and alerts the user proactively with a soothing alert that is customizable by a user and comprises computer generated human voice messages accompanied by visual characters and/or video animations; and wherein the battery charge level for the device is monitored for a past period of time with an intelligent proprietary algorithm to determine if a battery is strong or weak and the selected level is updated based on this determination. These alerts can be applied to any electronic device that requires power management and will work in conjunction with any type of battery. This product is ideal for use in administrative and medical/hospital businesses in mobile computer carts that require power management. The TPMU program provides users with an efficient device and method for monitoring remaining battery charge levels and detecting when battery charge levels are dangerously low.

The disclosed invention comprises a computer-implemented system and method for monitoring remaining battery charge levels and detecting when battery charge levels are low. The system is comprised of a hardware/software program that has the ability to read all batteries and their respective charging levels on any mobile computer cart requiring power management, and alerting a user of those levels via audio/video message alerts. Specifically, the system sends an alert to a user once a low battery charge level and/or a predetermined threshold level has been met and if the user does not respond and charge the device, the device will automatically enter a detect and protect mode.

Referring initially to the drawings, FIG. 1 illustrates a computer-implemented system for monitoring a remaining battery charge level in a device and detecting when said battery charge level is reduced to a selected level 100. The system 100 comprises a monitoring component 102 that monitors the battery charge levels for any device that requires power management. The monitoring component 102 can monitor all types of batteries, such as lithium ion, lithium phosphate, or any other type of battery as is known in the art without affecting the overall concept of the invention. The monitoring component 102 monitors the battery charge levels of all types of batteries for mobile computer carts and their respective devices, such as laptops, thin clients computers, etc., as is known in the art without affecting the overall concept of the invention. Further, the monitoring component 102 communicates with a detection component 104. The detection component 104 detects when the battery charge levels of the mobile cart and/or its devices are equal to or less than the selected level. Typically, the selected battery charge levels are approximately between 0-30%, more preferably approximately 30%. Additionally, the detection component 104 can be programmed to detect battery charge levels at different levels, and/or to detect battery charge levels at a predetermined threshold level. For example, the detection component 104 can detect a weak battery and start alerting a user when approximately 50% of the battery charge is left. The detection component 104 can also detect a stronger or newer battery and start alerting a user when approximately 40% of the battery charge is left. However, for both weak and strong batteries, the detection component 104 detects the battery charge level and places the device in a detect and protect mode when approximately 30% of the battery charge is left.

The system's 100 unique detect and protect mode can detect if a battery is weak (old) or strong (new) based on an algorithm that keeps track of daily charging level patterns. Further, the system 100 will start talking to a user with computer-generated human voice messages including visual and animated characters when battery charge capacity is 50% or less in case of a weak battery and 40% or less in case of a strong battery. The mode can detect when the battery reaches a dangerously low charge level of 30% and provides a 2 minute warning before the mobile computer cart is taken into a protect mode which is a hybrid power mode where the battery is trickle drained. Trickle draining the battery requires only a small amount (or trickle) of power to keep the battery running. Thus, this trickle drain feature will keep the battery charged for three times longer than the sleep mode option that most operating systems offer currently. Further, if the user responds to any of the computer-generated human voice messages including visual and animated characters and plugs the device (mobile computer cart) into an electrical outlet, protect mode is not activated. If the user plugs the device in an electrical outlet after the device goes into protect mode, a user must wiggle/click the mouse or click a key on the keyboard to activate the device and bring it out of protect mode. Furthermore, if a user is not using the mobile computer cart for more than 30 minutes, the software will detect the idle time and will force the device into protect mode, avoiding further draining of the battery. User can also schedule a time in the day and/or week for the device to go automatically into detect and protect mode and when to automatically wake up. Thus, use of the detect and protect mode will reduce cost of frequent battery replacement and will reduce landfill requirements and constitutes a greener environment.

Furthermore, there are two types of monitoring solutions (a hardware solution and a software solution) that will monitor battery charge levels depending on the type of battery and the unit in which the battery is used. Specifically, the hardware solution will monitor any type of rechargeable or non-rechargeable battery that uses "no" inverter on the device. A hardware electronic circuit (described more fully below) is connected to the terminals of the battery. The electronic circuit collects the current amperes from the battery and calculates accurate charge levels to output warnings. The software solution monitors any type of rechargeable battery using all types of inverters installed on devices. The inverter provides a feedback signal with information about the remaining battery charge level and source of power (i.e., AC or Battery). This feedback data is analyzed by the monitoring component 102 and submitted to the detection component 104 for output warnings (alerts). The monitoring component 102 also monitors when the power (AC) is resumed and as soon as the power is resumed, the monitoring component 102 wakes up the device from detect and protect mode to normal operation mode.

Based on the battery charge levels provided by the monitoring component 102, the detection component 104 will check if the device is in use or not by a user. For example, if the battery is weak or older the detection component 104 checks the threshold of remaining battery charge (RBC) and when RBC equals approximately 50%, and alert is emitted to the user. The alert includes an audio and/or voice alert and/or displaying a visual pop-up with an animated character. During this example, alerts will repeat every 1 minute until the RBC is approximately 35% or less. When the RBC equals approximately 35%, a two minute warning to put the device into detect and protect mode is displayed. When the RBC equals approximately 30%, the device will be gracefully placed into detect and protect mode.

In another example, if the battery is stronger or new and in use by a user the detection component 104 checks the threshold of remaining battery charge (RBC) and when the RBC equals approximately 40%, a first alert is emitted. The alert includes playing audio and/or a voice alert with no visual pop-up or animated character since the device is currently in use. During this example, alerts will repeat every one minute until the RBC is approximately 35% or less. When the RBC equals approximately 35%, a two minute warning to put the device into detect and protect mode is displayed. When RBC equals approximately 30%, the device will be gracefully placed into detect and protect mode.

The system 100 further comprises a trigger component 106 that sends an alert to a user once the battery charge level is equal to or less than the selected level. The alert is customizable by a user, and alerts the user proactively with a soothing message. The alerts can be audio message alerts, video message alerts, or both audio and video message alerts. These alerts can be customized by the user to be specific male or female voices, or even animated characters. The alerts can also be customized to speak various sentences in multiple languages and accents as requested by a user, as part of the alert messages providing meaningful actions based on different cases. Further, the alerts can be played at custom volume levels and can also be scheduled to speak when needed. For example, you can schedule the alert not to speak at night and to only display a message or to speak in a low volume during the night due to low ambient noise at night or it can be muted in pediatric areas. Furthermore, the audio message alerts can be accompanied by video animations. The message alerts provide voice messages when needed and are based on user requirements. When a device meets a threshold condition the software detects if the device is in use by a user and if "yes" only a soothing audio voice alert message is played warning the user that the battery is getting low. If the device is "not" in use, both an audio or a voice message and a pop-up display message with animated characters will be played on the screen. For example, animated characters will perform gestures on the device depending on the type of audience. Specifically, children could see a racing car move across the screen, a smiley bouncing ball, etc. For adult users it could be a picture showing a power plug being plugged into an electrical outlet, etc. The system permits characters and voices to be customized by gender and user.

Furthermore, the audio or voice messages are produced by a variety of customized pre-recorded voice message audio clips. These audio clips can be language and gender specific. Typically, the audio clips are software files provided within the software system or the audio clips can be stored programmatically on a chip in case of a hardware system. The computer-generated human voice messages include visual and animated characters and are designed to alert a user automatically when a device requires charging or when it is fully charged. The voice messages can also be specific for a pediatric audience and would be customizable by the end user. For example, some of the messages can include, but are not limited to, "I am running out of power, please plug me into an electrical outlet," "my battery power will end in 2 minutes, please plug me into an electrical outlet," "I am completely out of power, I am going into protect mode now," "I am fully charged please unplug and use me at any time," "I am charging now," and "partially charged," etc. Additionally, these message alerts can be applied to any device of the mobile computer cart that requires power management and will work in conjunction with any type of battery.

Furthermore, TPMU software analyzes the battery charge level data stored in the Microsoft SQL database over a period of time and predicts the expected life of the battery based on usage pattern. The software generates reports and displays the battery replacement status under 2 categories "Replace Soon" and "Replace Now" on a centrally displayed dashboard monitor that clinical staff monitors all the time. Also, TPMU software emails the reports to management to plan their budget for replacing batteries. Further, TPMU software using the data stored in the database analyzes the usage of the cart and displays the usage/utilization of the cart on dashboard in 3 categories "Heavily Used", "Moderately Used" and "Rarely Used" in the form of the bar graph. Further the TPMU software provides ROI (Return On Investment) calculators for the user to calculate the cost savings related to "Field Services deployment", "Battery Replacement" and "Availability of cart".

Further, the system 100 comprises a power component 108 that places the device in the detect and protect mode after a predetermined period of time. The power component 108 will execute a command when the battery charge criteria is met, placing the device into the detect and protect mode by using manufacturer's specifications from the device. The power component 108 also detects when power has been restored (i.e., device plugged in), thus waking the device up.

Specifically, the trigger component 106 sends an alert to a user once a low battery charge level and/or a predetermined threshold level has been met and if the user does not respond and charge the device, the power component 108 will gracefully place the device in a detect and protect mode, effectively elongating the life of the battery and reducing the cost of replacing the battery. Typically, once the trigger component 106 sends an alert to a user, a predetermined period of time passes and then the power component 108 automatically places the device in a detect and protect mode. Thus, the system 100 automatically talks to the user about the battery status and ensures that the mobile computer carts and their respective devices are properly charged before the user experiences an interruption related to a lack of power. Typically, the system 100 alerts the user with voice alerts repeatedly every 2 minutes and users need to plug the mobile computer cart into an electrical outlet to stop the voice alerts. Over a period of time, users get disciplined to plug the cart into electrical outlets to avoid the voice alerts. This makes the mobile computer carts always available and charged when needed.

Furthermore, the monitoring component 102 and the detection component 104 of the system 100 comprise a software program (TPMU software) and/or hardware (TPMU hardware) to enable the monitoring component 102 and the detection component 104 to recognize all batteries from various mobile computer carts and their respective devices requiring power management, and to monitor and detect the battery charge level on these carts and devices, and to alert a user of these battery charge levels via audio/video message alerts. Specifically, a software program can be utilized to monitor the battery charge levels and trigger the message alert. The software program comprises middleware that communicates with the mobile computer cart to capture specific battery charge levels and trigger the message alert. Alternatively, or in addition to, hardware can be utilized to monitor the battery charge levels and trigger the message alert. The hardware comprises a microchip programmed with a software program which monitors the battery levels and triggers message alerts.

The TPMU software (Client) program performs the following functions: the software program collects the remaining battery charge (RBC) from the "TPMU hardware" or from the inverter if one exists. The software program determines the source of power to the device (DC or AC) from the "TPMU hardware" or from the inverter if one exists. The software program generates various alerts audio, visual, animated characters etc. based on the different threshold RBC values. The software program senses the usage of the device based on user activity. The software program places the mobile computer cart into detect and protect mode when RBC is below the threshold value of approximately 30%. The software program wakes up the mobile computer cart when the power is resumed.

The software program is smart to compliment the user when user responds to the alerts and takes necessary action of plugging in the mobile computer cart to an electrical outlet. For example, the software automatically detects a change in the power source going from battery to AC (electrical outlet) and senses when a user is following or reacting to the recommended power management messages being given on the device. When the user follows the required power management messages or responds to the messages by plugging the mobile computer cart in, the user will receive an audio voice message, such as "Thank you for plugging the device in". Furthermore, the software program warns the user if device is unplugged without being fully charged. The software program provides a battery charge level indicator that helps the user to select the mobile computer cart for use when the charge is full.

Additionally, the software program provides a tool for the user to get the specifications, statistics and details of the mobile computer cart. The software program comprises a console device (or dashboard) that collects statuses from multiple mobile computer carts and their respective devices (i.e., laptops, etc.) and displays the information on the console device. The console device can be viewed and monitored by users via a central location that is distinct from the mobile computer carts. For example, the software program provides a graphical view of the battery charge levels for the past period of time (i.e., up to 90 days). The software program self-repairs itself in case of corruption. The software program determines if the battery is strong or weak based on the history of charge and discharge cycles. Further reports that can be displayed on the console device include, but are not limited to, a battery condition report, a battery age report, a battery charge level report, a device usage report, a device availability report, and a user response to alerts, etc.

The software program can also escalate certain incidents by interfacing with help desk software, email systems, pager or SMS alerts. Some of the specific incidents include No Device communication, No Inverter Data available, Program failure, No Alerts, Flat Battery, Low Battery, and Replace Battery, etc.

Furthermore, the TPMU software is designed to work on a single mobile medical computer cart for a physician in a hospital. The software is also designed to work on the mobile medical computer cart's respective device, such as a laptop. If the software is implemented in a physician's office or hospital on multiple mobile computer carts a "TPMU Server Software" is developed which then installs on a Windows® server using an SQL server as the database. All the client devices communicate with the server to send and receive data for installation, configuration, customization, patching, reporting purposes and also to maintain licenses.

Features of the TPMU Server Software include: groups the devices based on physical location or department; allocates the devices based on IP addresses to groups; applies the configuration policies to the devices based on the following specifications; visual and audio voice message alerts (which are configurable with, but not limited to, adult male or adult female or child voice, duration of alert, beeps, alert repeat intervals, or modifying visual text); volume control (user customizable audio level); batteries (user selection of number of batteries which includes internal and external batteries); power save (use customizable settings for saving power by placing the device in detect and protect mode when not in use); dormant (placing the devices un-used for a long period, which is customized by a user, into a dormant state and removing them from a database after a very long extended period in the dormant state; license (maintaining and sending warnings to administrators about licensing related information); and TPMU Server software categorizes the devices into online devices, offline devices, standby devices and alerting devices.

The software also keeps track of mobile computer cart and respective device status relating to alerts and battery usage, etc. and stores the information in a database. This information is later used for generating custom reports. The software interfaces with call center software to automatically open tickets via HL7, SQL and VBScripts and sends escalation emails, text messages, or pager messages. The software interfaces with the helpdesk or call center software to open trouble tickets or issues based on the escalation situation. The server communicates with the client software and collects data from the client related to RBC and power sources and stores the data in the database. Further, the client sends critical information about when the device was placed in detect and protect mode and when it was woken up from detect and protect mode to the server. The software displays information on a dash board (or console device). The information includes categorizing devices by geographical locations, specific details related to each device's usage and current battery status. The software can also run reports related to financial, device usage, and current battery status.

Figure 2:
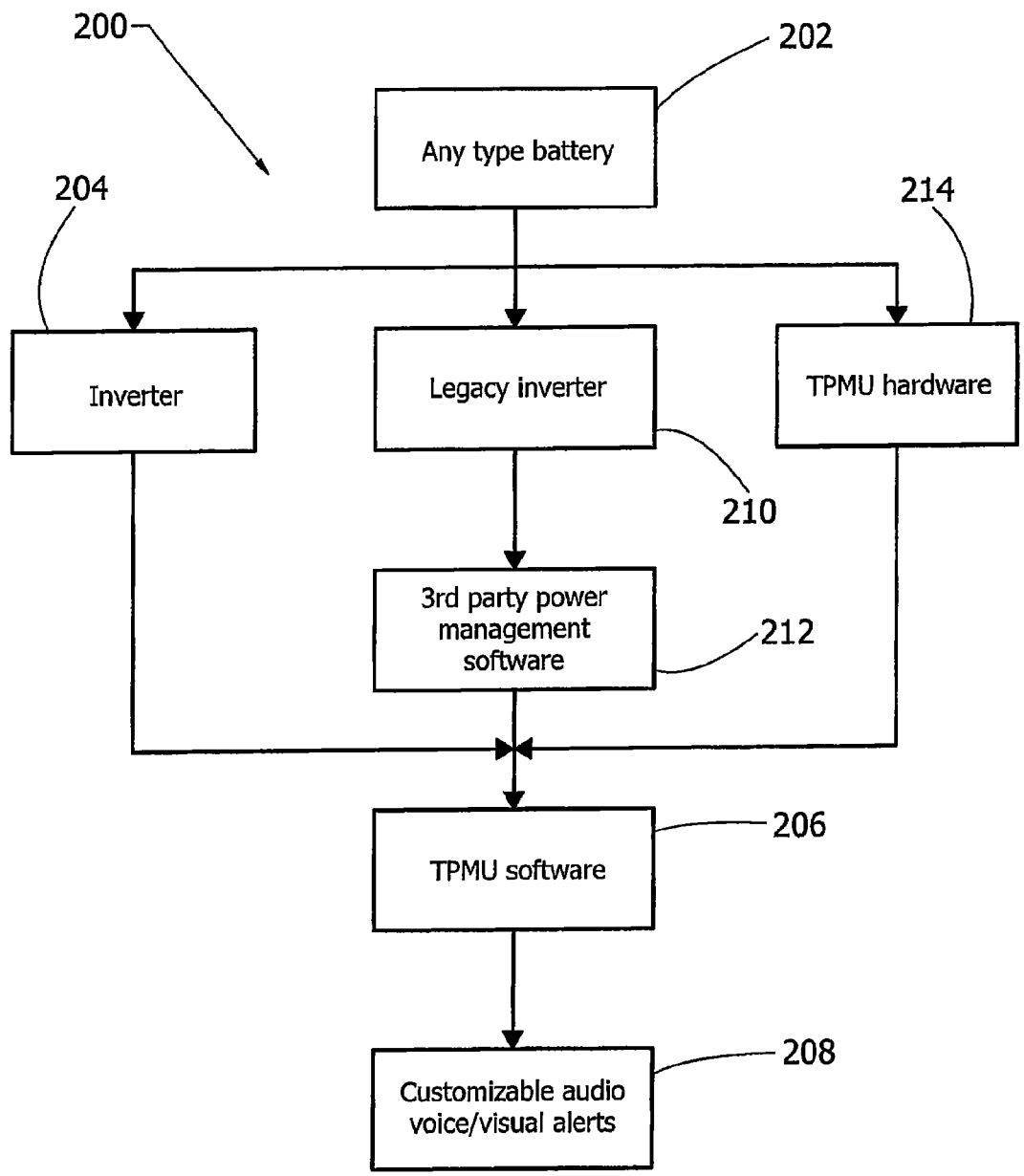
FIG. 2 illustrates a logical flowchart of the system for monitoring remaining battery charge levels and detecting when battery charge levels are low in accordance with the disclosed architecture.

FIG. 2 illustrates a logical flowchart of the system 200 for monitoring remaining battery charge levels and detecting when battery charge levels are low. At 202, any type of battery is recognized from a mobile computer cart requiring power management. Specifically, the software program uses an internal database which consists of various manufacturers, device model numbers and the battery types used in mobile computer carts. Battery type is detected based on the data in database. This database is updated periodically via upgrades or patches and/or firmware updates. Then at 204, an inverter is contacted to change the battery to a recognized power supply, i.e., battery or alternating current (AC). The software program monitors and uses the data from an inverter created by the manufacturer of the device. The inverter has two functions that the software compiles from. First, the hardware converts the DC voltage to AC, and second the software compiles and provides the remaining battery charge level of the internal battery of the device such that the message alerts can be sent to the user when a specific criteria is met.

Once the battery is recognized, at 206 a software program that comprises middle ware communicates with the mobile computer cart to capture specific battery charge levels and trigger a message alert. At 208, if a low battery charge level and/or a predetermined threshold level has been met, a customizable audio, voice/visual message alert is sent to a user. The message alert can be audio message alerts, video message alerts, or both audio and video message alerts. For example, the message alerts are customizable audio/voice alerts with or without animated characters.

Additionally, to support some legacy inverters 210 that do not provide a feedback signal regarding RBC and the power source of the device to the TPMU Software, a third party program 212 (i.e., $3^{rd}$ Party Power Management Software) that can talk to the legacy inverter 210 is used as a middleware. This middleware program is interfaced with the TPMU Software 206 to collect the RBC and power source values and trigger a message alert. At 208, if a low battery charge level and/or a predetermined threshold level has been met, a customizable audio, voice/visual message alert is sent to a user.

Finally, hardware instead of software can be utilized to monitor the battery charge levels and trigger the message alert. At 214, hardware that comprises a microchip programmed with a software program which monitors the battery levels and triggers message alerts is utilized. Specifically, at 206, the software program programmed in the microchip comprises middle ware that communicates with the mobile computer cart to capture specific battery charge levels and trigger a message alert. At 208, if a low battery charge level and/or a predetermined threshold level has been met, a customizable audio, voice/visual message alert is sent to a user.

Figure 3:
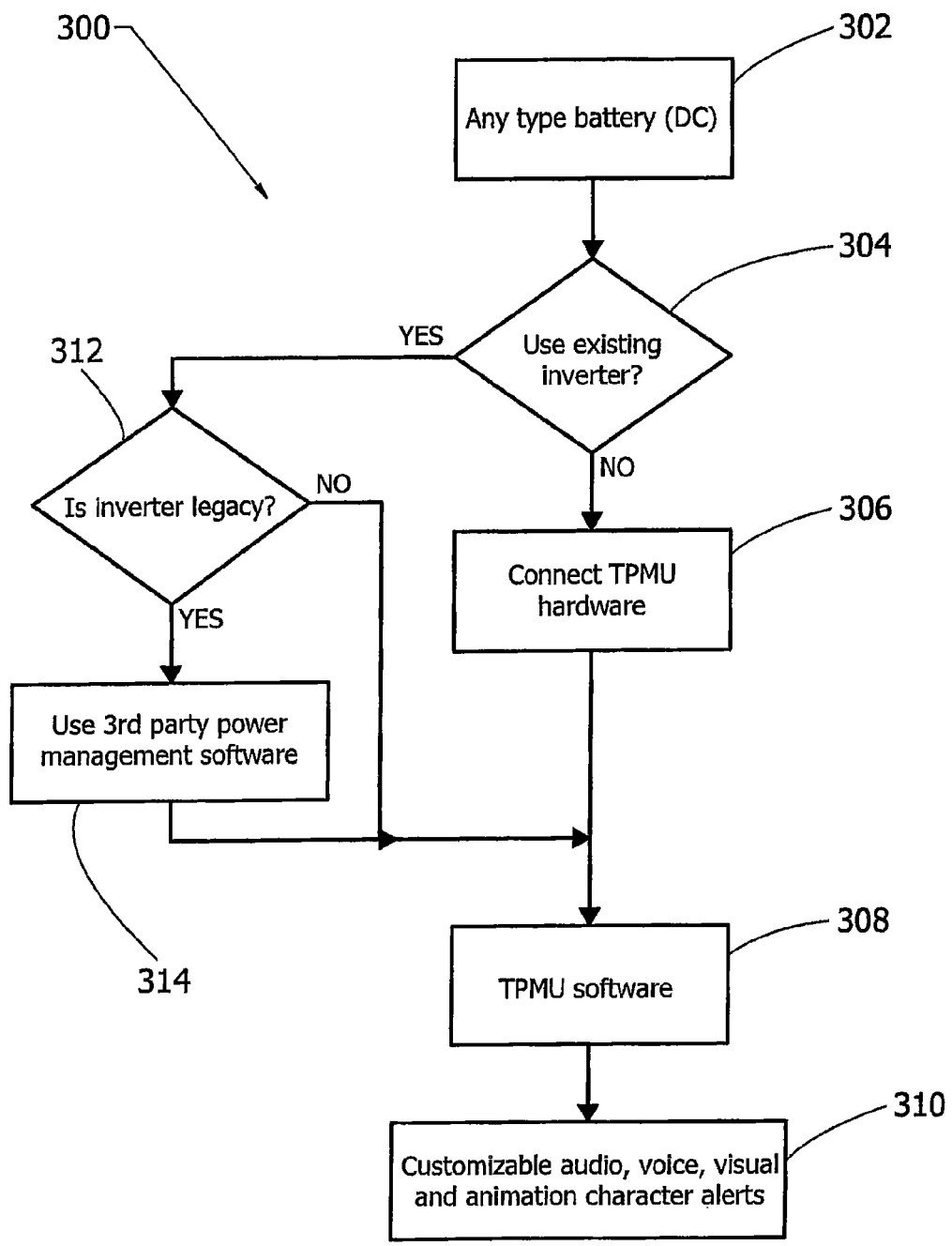
FIG. 3 illustrates a technical flowchart of the system for monitoring remaining battery charge levels and detecting when battery charge levels are low in accordance with the disclosed architecture.

FIG. 3 illustrates a technical flowchart of the system 300 for monitoring remaining battery charge levels and detecting when battery charge levels are low. At 302, any type of battery is recognized from a mobile computer cart requiring power management. Then at 304, it is determined whether to use an existing inverter in the device to collect the remaining Battery Charge (RBC) and power source (i.e., battery or alternating current (AC)) information. If an existing inverter is not used, then at 306 TPMU hardware is directly brought into communication with the battery to monitor the battery charge levels and trigger the message alert. The hardware comprises a microchip programmed with a software program which monitors the battery levels and triggers message alerts. Once the TPMU hardware is brought in, the software program that is programmed in the microchip comprises firmware that will communicate with the mobile computer cart to capture specific battery charge levels and trigger a message alert. At 308, TPMU software triggers the alerts based on battery threshold levels. The software also detects the usage of the device by tracking keyboard and mouse clicks. The software also places the device into detect and protect mode when not in use saving battery power and wakes up the device when the device is activated for use. At 310, the alert will be played in any customizable format as decided by the user which include, but are not limited to, audio voice, visual, animated character. Audio alerts are played via the speaker on the device or the speaker on the TPMU hardware. Visual and animation characters are displayed or played on the device's screen or the TPMU hardware screen.

If the inverter is needed at 304, then at 312 a check is made to determine if the inverter is a legacy inverter. If the inverter is a legacy inverter, then at 314 a third party power management software is utilized to communicate with the legacy inverter to collect the remaining battery charge (RBC) and power source (i.e., battery or alternating current (AC)) information. At 308, TPMU software triggers the alerts based on battery threshold levels. At 310, the alert will be played in any customizable format as decided by the user which include, but are not limited to, audio voice, visual, animated character. Audio alerts are played via the speaker on the device or the speaker on the TPMU hardware. Visual and animation characters are displayed or played on the device's screen or the TPMU hardware screen.

If the inverter is NOT a legacy type at 312, then at 308, TPMU software communicates with the inverter directly to trigger the alerts based on battery threshold levels. At 310, if a low battery charge level and/or a predetermined threshold level has been met, a customizable message alert is sent to a user. The message alert can be audio message alerts, video message alerts, or both audio and video message alerts. For example, the message alerts are customizable audio/voice alerts with or without animated characters. Visual and animation characters are displayed or played on the mobile cart's screen.

Figure 4:
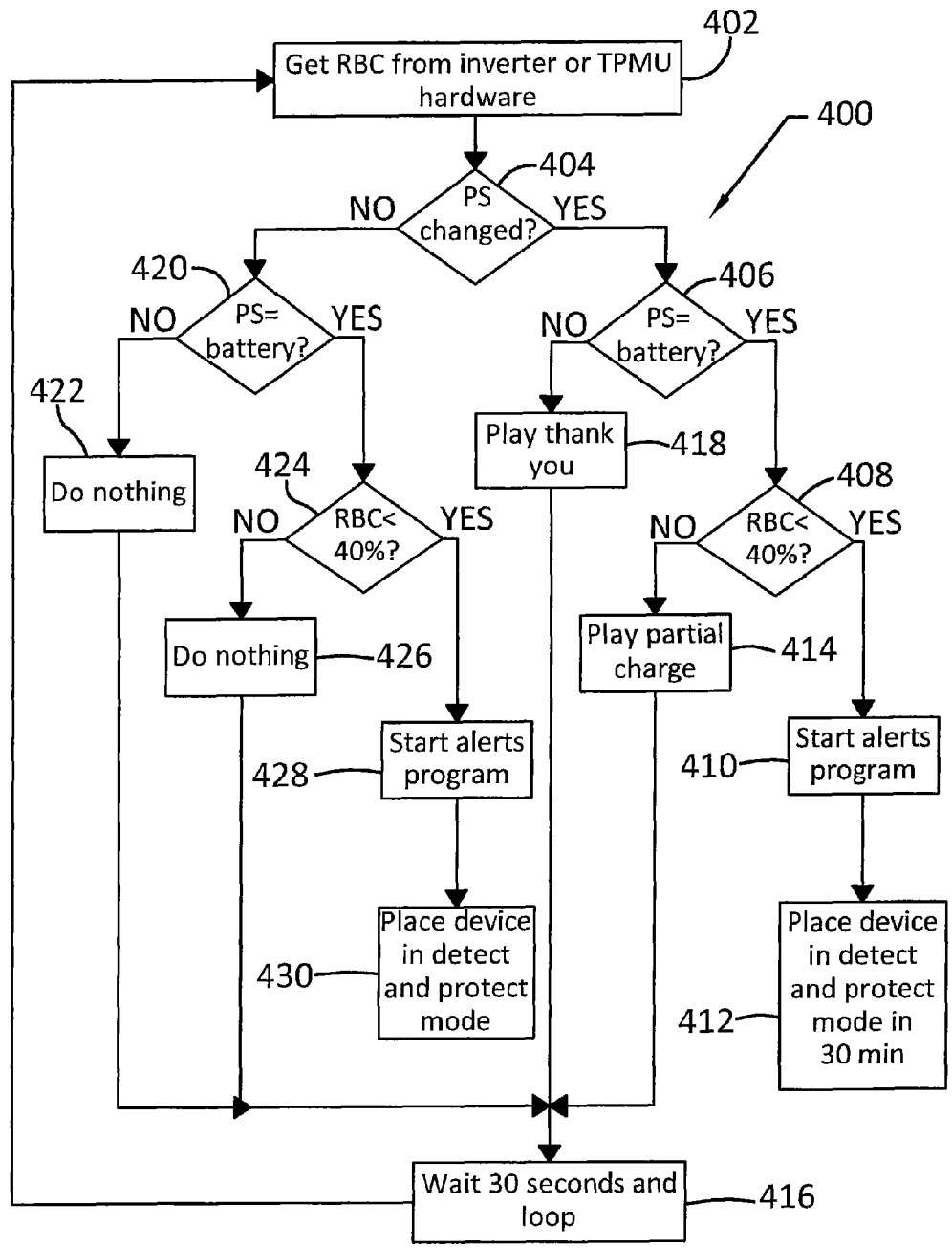
FIG. 4 illustrates a software flowchart of the system for monitoring remaining battery charge levels and detecting when battery charge levels are low in accordance with the disclosed architecture.

FIG. 4 illustrates a software flowchart of the system 400 for monitoring remaining battery charge levels and detecting when battery charge levels are low. At 402, any type of battery is recognized from a mobile computer cart requiring power management. The remaining battery capacity (RBC) of the device is then acquired from an inverter or from the TPMU hardware. At 404, it is determined whether the power source (PS) (i.e., a battery or AC) of the device has been changed by the user by physically plugging or unplugging the mobile computer cart to or from an electrical outlet or if there is a power outage or a power restore. If the power source has been changed, then at 406 it is determined if the power source is a battery. If the power source is not a battery, (i.e., its AC) then, at 418 the user is complimented for plugging the device into an electrical outlet. The compliment is done by playing a customizable audio, voice message depending on whether the action was performed by a user or by an automatic power restore. Then at 416, the software waits approximately thirty seconds and loops back to repeat the process.

If at 406, the power source is changed to a battery (unplug event or power outage event), then at 408 it is determined if the remaining battery capacity (RBC) is less than 40%. If the RBC is less than 40%, then at 410 the Alert Program is started and a customizable audio voice and/or visual message alert is sent to a user. At 412, the device is placed into detect and protect mode automatically in approximately thirty minutes. Specifically, once an alert has been sent to a user, a predetermined period of time passes (i.e., approximately thirty minutes), and then the device is automatically placed into detect and protect mode. During this 30 minute alert period, a sequence of alerts at regular intervals are played or displayed to the user. These alerts include, but are not limited to, audio voice, visual, animated character and are fully customizable by the user.

If at 408, the RBC is greater than or equal to 40%, then the user has physically unplugged the mobile computer cart from an electrical outlet or there was a power outage. At 414, an alert is then sent to the user with a warning message that the mobile computer cart is only partially charged. These alerts include, but are not limited to, audio voice, visual, animated character and are fully customizable by the user. Then at 416, the software waits approximately thirty seconds and loops back to repeat the process.

As stated supra at 402, the remaining battery capacity (RBC) of the device is acquired from an inverter or from TPMU hardware. At 404, it is determined whether the power source (PS) (i.e., a battery or AC) of the device has been changed by the user by physically plugging or unplugging the mobile computer cart to or from an electrical outlet or if there is a power outage or a power restore. If the power source has not been changed (i.e., after waiting 30 seconds at 416, the power source battery or AC remain the same as before), then at 420 it is determined if the power source is a battery. If the power source is not a battery, then at 422 the software does nothing since there is no change in power source and continues as before. Then at 416, the software waits approximately thirty seconds and loops back to repeat the process.

If at 420, the power source is a battery, then at 424 it is determined if the remaining battery capacity (RBC) is less than 40%. If the RBC is greater than or equal to 40%, then at 426 the software does nothing. Then at 416, the software waits approximately thirty seconds and loops back to repeat the process.

If at 424, the RBC is less than 40% then, at 428 the Alert Program is started and a customizable message alert is sent to a user for a continuous period of 30 minutes. These alerts include, but are not limited to, audio voice, visual, animated character and are fully customizable by the user. At 430, the device is placed in detect and protect mode automatically in approximately thirty minutes. Specifically, once an alert has been sent to a user, a predetermined period of time passes with frequent alerts (i.e., approximately thirty minutes), and then the mobile computer cart is automatically placed in detect and protect mode. The predetermined period of time can be factory set or customizable by the user.

Figure 5:
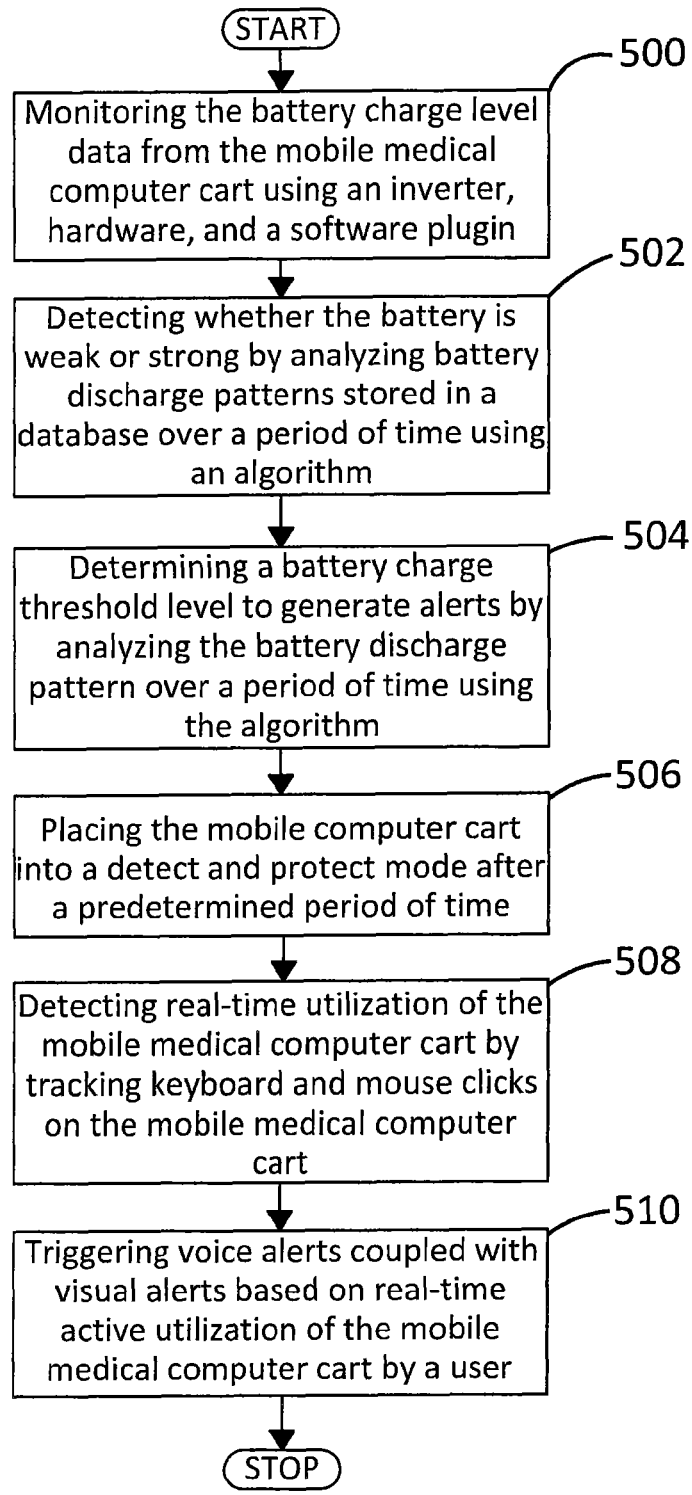
FIG. 5 illustrates a computer-implemented method for monitoring remaining battery charge levels and detecting when battery charge levels are low in accordance with the disclosed architecture.

FIG. 5 illustrates a computer-implemented method for monitoring a remaining battery charge level in a mobile computer cart and detecting when said battery charge level is reduced to a selected level, according to various aspects of the innovation. While, for purposes of simplicity of explanation, the one or more methodologies shown herein (e.g., in the form of a flow chart or flow diagram) are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation.

Referring to FIG. 5, a method for alerting clinical staff in a hospital environment about a remaining battery charge level on a mobile medical computer cart by monitoring battery charge levels over a period of time is illustrated. Typically, a mobile medical computer cart that requires power management is utilized. At 500, battery charge level data from the mobile medical computer cart are monitored and collected using an inverter, hardware, and a software plugin. Typically, hardware is utilized to monitor the battery charge level and trigger an alert. The hardware decodes signals coming from the battery or inverter to output the battery charge level and trigger the alert. Specifically, the hardware comprises a microchip programmed with software to monitor the battery charge level and store it in a database for analysis. Further, the collected battery charge level data is stored in a central database on a server in a hospital network with time stamps for future analysis along with battery charge level data collected from all mobile medical computer carts in a hospital network. Additionally, the software plugin interfaces with the inverter to read, understand and convert the battery charge level data to usable form. The software plugin can be customized to read and understand various data formats produced by different inverter manufacturers. And, the reports run by the algorithm or software plugin can be displayed on a dashboard.

At 502, detection of whether a battery is weak or strong by analyzing battery discharge patterns stored in a database for a period of time is performed using an algorithm. The algorithm analyzes battery data in the database to determine the following parameters: change in battery charge percentage in a given time period, battery charge cycles, time taken to fully charge the battery, time period medical mobile computer cart was plugged in for charging, time period of battery discharge, depth of battery discharge, discharge and charge pattern in a day/week/month/year, load on battery, and number of times battery was depleted to a flat battery in a predetermined period of time. Once the parameters are determined, the results are then used to determine if the battery is a strong or weak battery. The parameter results can also be used to calculate threshold charge levels for the battery to start alerts and to put the mobile medical computer cart into detect and protect mode.

At 504, a battery charge threshold level is determined to generate alerts by analyzing the battery discharge pattern over a period of time using the algorithm. At 506, the mobile medical computer cart is placed into a detect and protect mode after a predetermined period of time. Typically, once an alert is sent to a user, a predetermined period of time passes and then the device is automatically placed into a detect and protect mode. The predetermined period of time can be factory set or customizable by the user. Typically, the detect and protect mode is decided based on how many times the user is alerted and based on the battery discharge level. Further, the detect and protect mode puts the battery into a trickle drain mode.

At 508, real-time utilization of the mobile medical computer cart is detected by tracking keyboard and mouse clicks on the mobile medical computer cart. And at 510, voice alerts coupled with visual alerts are triggered based on real-time active utilization of the mobile medical computer cart by a user. The alert is a user customizable computer-generated human voice message which includes visual and animated characters. For example, the message alerts are customizable audio/voice alerts with or without animated characters. The alerts can be customized in multiple languages, accents and include female or male voices. The alerts can be played at a custom volume for different hospital departments and can be scheduled to speak or be muted at specific times. The volume of the alerts can be automatically adjusted to a lower volume during nights as ambient noise is usually lower. Further, the alert can be automatically muted from a central console for all mobile medical computer carts in a specific area, (i.e., pediatric unit).

As used in this application, the terms "component" and "system" are intended to refer to a computer-related entity, either hardware, a combination of hardware and software, software, or software in execution. For example, a component can be, but is not limited to being, a process running on a processor, a processor, a hard disk drive, multiple storage drives (of optical, solid state, and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. The word "exemplary" may be used herein to mean serving as an example, instance, or illustration. Any aspect or design described herein as "exemplary" is not necessarily to be construed as preferred or advantageous over other aspects or designs.

Figure 6:
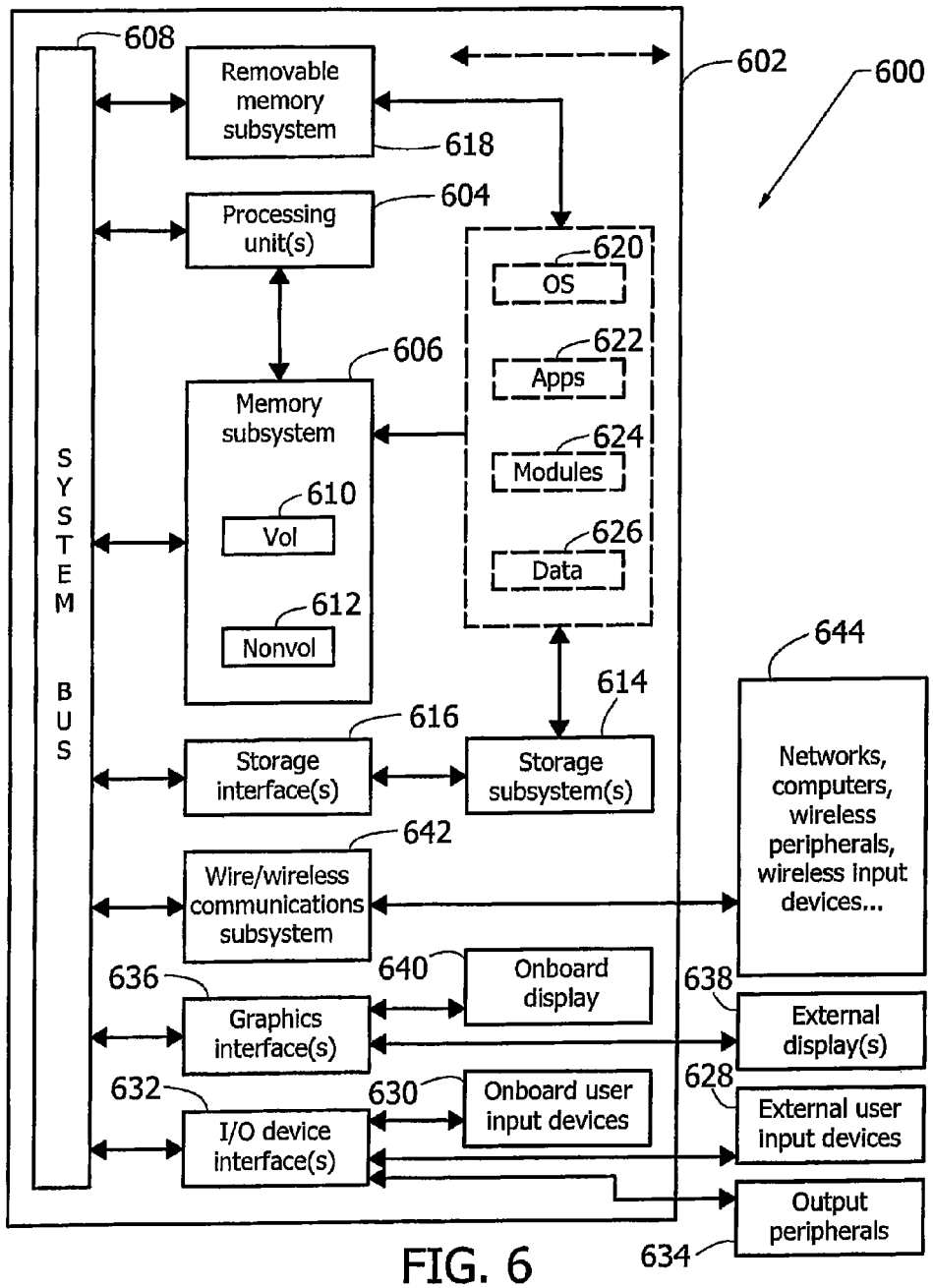
FIG. 6 illustrates a block diagram of a computing system operable to execute the monitoring and detecting system in accordance with the disclosed architecture.

Referring now to FIG. 6, there is illustrated a block diagram of a computing system 600 operable to execute the monitoring and detecting system in accordance with the disclosed architecture. In order to provide additional context for various aspects thereof, FIG. 6 and the following discussion are intended to provide a brief, general description of the suitable computing system 600 in which the various aspects can be implemented. While the description above is in the general context of computer-executable instructions that can run on one or more computers, those skilled in the art will recognize that a novel embodiment also can be implemented in combination with other program modules and/or as a combination of hardware and software.

The computing system 600 for implementing various aspects includes the computer 602 having processing unit(s) 604, a system memory 606, and a system bus 608. The processing unit(s) 604 can be any of various commercially available processors such as single-processor, multi-processor, single-core units and multi-core units. Moreover, those skilled in the art will appreciate that the novel methods can be practiced with other computer system configurations, including personal computers (e.g., desktop, laptop, etc.), each of which can be operatively coupled to one or more associated devices.

The system memory 606 can include volatile (VOL) memory 610 (e.g., random access memory (RAM)) and non-volatile memory (NON-VOL) 612 (e.g., ROM, EPROM, EEPROM, etc.). A basic input/output system (BIOS) can be stored in the non-volatile memory 612, and includes the basic routines that facilitate the communication of data and signals between components within the computer 602, such as during startup. The volatile memory 610 can also include a high-speed RAM such as static RAM for caching data.

The system bus 608 provides an interface for system components including, but not limited to, the memory subsystem 606 to the processing unit(s) 604. The system bus 608 can be any of several types of bus structure that can further interconnect to a memory bus (with or without a memory controller), and a peripheral bus (e.g., PCI, PCIe, AGP, LPC, etc.), using any of a variety of commercially available bus architectures.

The computer 602 further includes storage subsystem(s) 614 and storage interface(s) 616 for interfacing the storage subsystem(s) 614 to the system bus 608 and other desired computer components. The storage subsystem(s) 614 can include one or more of a hard disk drive (HDD), a magnetic floppy disk drive (FDD), and/or optical disk storage drive (e.g., a CD-ROM drive DVD drive), for example. The storage interface(s) 616 can include interface technologies such as EIDE, ATA, SATA, and IEEE 1384, for example.

One or more programs and data can be stored in the memory subsystem 606, a removable memory subsystem 618 (e.g., flash drive form factor technology), and/or the storage subsystem(s) 614 (e.g., optical, magnetic, solid state), including an operating system 620, one or more application programs 622, other program modules 624, and program data 626.

The aforementioned application programs 622, program modules 624, and program data 626 can include the computer-implemented system 100 of FIG. 1, including the monitoring component 102, the detection component 104, the trigger component 106, and the power component 108, and, the entities and components and arrangement of system 200 of FIG. 2, system 300 of FIG. 3, and system 400 of FIG. 4. The aforementioned application programs 622, program modules 624, and program data 626 can also include the methods represented by the flow chart of FIG. 5, for example.

Generally, programs include routines, methods, data structures, other software components, etc., that perform particular tasks or implement particular abstract data types. All or portions of the operating system 620, applications 622, modules 624, and/or data 626 can also be cached in memory such as the volatile memory 610, for example. It is to be appreciated that the disclosed architecture can be implemented with various commercially available operating systems or combinations of operating systems (e.g., as virtual machines).

The storage subsystem(s) 614 and memory subsystems (606 and 618) serve as computer readable media for volatile and non-volatile storage of data, data structures, computer-executable instructions, and so forth. Computer readable media can be any available media that can be accessed by the computer 602 and includes volatile and non-volatile media, removable and non-removable media. For the computer 602, the media accommodates the storage of data in any suitable digital format. It should be appreciated by those skilled in the art that other types of computer readable media can be employed such as zip drives, magnetic tape, flash memory cards, cartridges, and the like, for storing computer executable instructions for performing the novel methods of the disclosed architecture.

A user can interact with the computer 602, programs, and data using external user input devices 628 such as a keyboard and a mouse. Other external user input devices 628 can include a microphone, an IR (infrared) remote control, a joystick, a game pad, camera recognition systems, a stylus pen, touch screen, gesture systems (e.g., eye movement, head movement, etc.), and/or the like. The user can interact with the computer 602, programs, and data using onboard user input devices 630 such a touchpad, microphone, keyboard, etc., where the computer 602 is a portable computer, for example. These and other input devices are connected to the processing unit(s) 604 through input/output (I/O) device interface(s) 632 via the system bus 608, but can be connected by other interfaces such as a parallel port, IEEE 1384 serial port, a game port, a USB port, an IR interface, etc. The I/O device interface(s) 632 also facilitate the use of output peripherals 634 such as printers, audio devices, camera devices, and so on, such as a sound card and/or onboard audio processing capability.

One or more graphics interface(s) 636 (also commonly referred to as a graphics processing unit (GPU)) provide graphics and video signals between the computer 602 and external display(s) 638 (e.g., LCD, plasma) and/or onboard displays 640 (e.g., for portable computer). The graphics interface(s) 636 can also be manufactured as part of the computer system board.

The computer 602 can operate in a networked environment (e.g., IP) using logical connections via a wired/wireless communications subsystem 642 to one or more networks and/or other computers. The other computers can include workstations, servers, routers, personal computers, microprocessor-based entertainment appliance, a peer device or other common network node, and typically include many or all of the elements described relative to the computer 602. The logical connections can include wired/wireless connectivity to a local area network (LAN), a wide area network (WAN), hotspot, and so on. LAN and WAN networking environments are commonplace in offices and companies and facilitate enterprise-wide computer networks, such as intranets, all of which may connect to a global communications network such as the Internet. Further, the software framework system can operate over the Internet in an Application Service Provider (ASP) environment, wherein the system is hosted at a data center and a user logs-in via a secure connection over the Internet.

When used in a networking environment the computer 602 connects to the network via a wired/wireless communication subsystem 642 (e.g., a network interface adapter, onboard transceiver subsystem, etc.) to communicate with wired/wireless networks, wired/wireless printers, wired/wireless input devices 644, and so on. The computer 602 can include a modem or has other means for establishing communications over the network. In a networked environment, programs and data relative to the computer 602 can be stored in the remote memory/storage device, as is associated with a distributed system. It will be appreciated that the network connections shown are exemplary and other means of establishing a communications link between the computers can be used.

The computer 602 is operable to communicate with wired/wireless devices or entities using the radio technologies such as the IEEE 802.xx family of standards, such as wireless devices operatively disposed in wireless communication (e.g., IEEE 802.11 over-the-air modulation techniques) with, for example, a printer, scanner, desktop and/or portable computer, personal digital assistant (PDA), communications satellite, any piece of equipment or location associated with a wirelessly detectable tag (e.g., a kiosk, news stand, restroom), and telephone. This includes at least Wi-Fi (or Wireless Fidelity) for hotspots, WiMax, and Bluetooth™ wireless technologies. Thus, the communications can be a predefined structure as with a conventional network or simply an ad hoc communication between at least two devices. Wi-Fi networks use radio technologies called IEEE 802.11x (a, b, g, etc.) to provide secure, reliable, fast wireless connectivity. A Wi-Fi network can be used to connect computers to each other, to the Internet, and to wire networks (which use IEEE 802.3-related media and functions).

Figure 7:
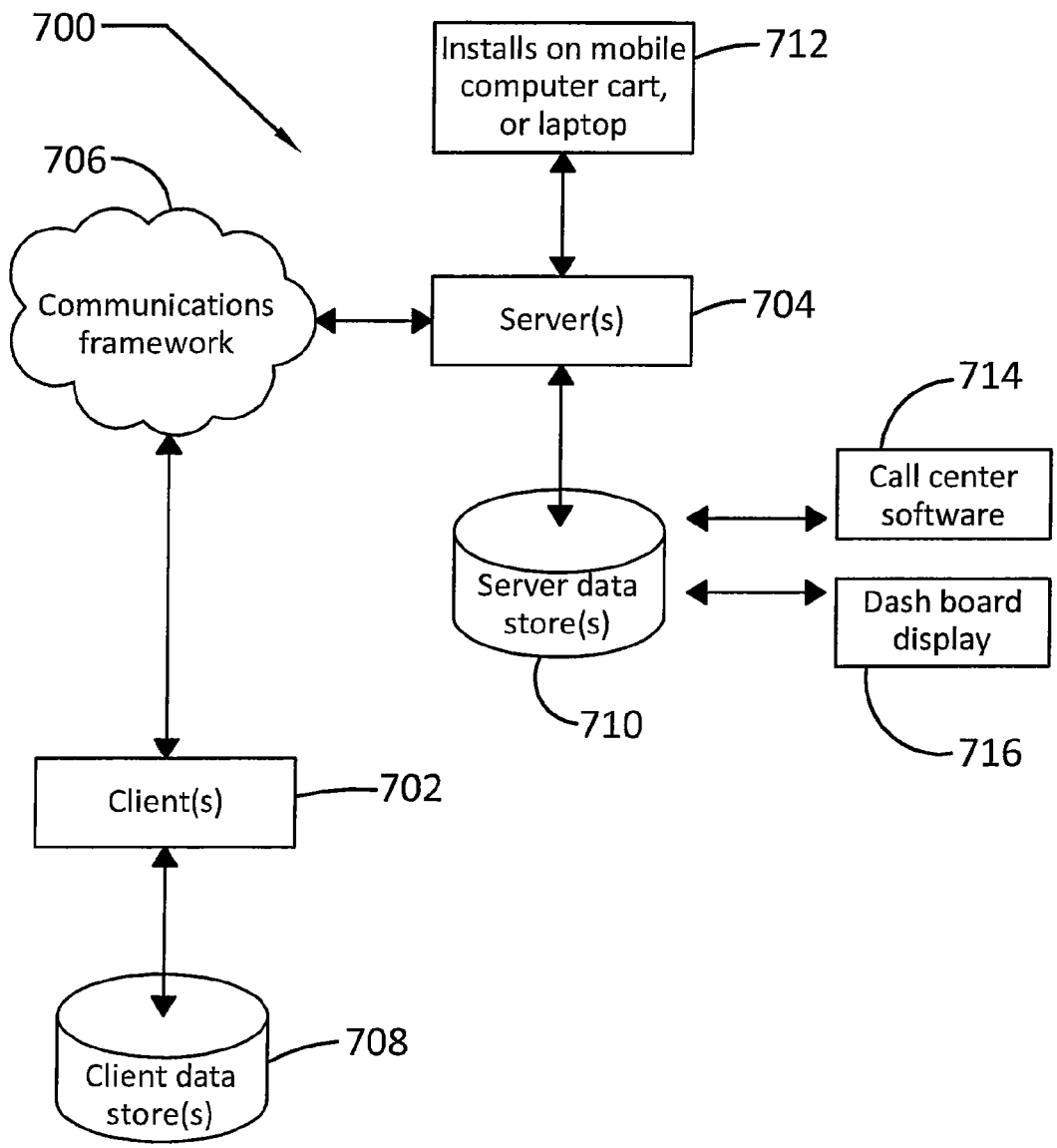
FIG. 7 illustrates an exemplary computing environment operable to provide support for the monitoring and detecting system.

Referring now to FIG. 7, there is illustrated a schematic block diagram of a computing environment 700 operable to provide support for the software framework. Specifically, FIG. 7 shows the schematic block diagram of the complete solution involving the server, client communication. The environment 700 includes one or more client(s) 702. The client(s) 702 can be hardware and/or software (e.g., threads, processes, computing devices). The client(s) 702 can house cookie(s) and/or associated contextual information, for example.

The environment 700 also includes one or more server(s) 704. The server(s) 704 can also be hardware and/or software (e.g., threads, processes, computing devices). The servers 704 can house threads to perform transformations by employing the architecture, for example. One possible communication between a client 702 and a server 704 can be in the form of a data packet adapted to be transmitted between two or more computer processes. The data packet may include a cookie and/or associated contextual information, for example. The environment 700 includes a communication framework 706 (e.g., a global communication network such as the Internet) that can be employed to facilitate communications between the client(s) 702 and the server(s) 704.

Communications can be facilitated via a wire (including optical fiber) and/or wireless technology. The client(s) 702 are operatively connected to one or more client data store(s) 708 that can be employed to store information local to the client(s) 702 (e.g., cookie(s) and/or associated contextual information). Similarly, the server(s) 704 are operatively connected to one or more server data store(s) 710 that can be employed to store information local to the servers 704.

Furthermore, the TPMU software is designed to work on a mobile computer cart for a physician's office or hospital (see 712). The software is also designed to work on a laptop or tablet (see 712). If the software is implemented in a physician's office or hospital on multiple devices a "TPMU Server Software" is developed which then installs on a Windows server using SQL server as the database. All the client devices communicate with the server to send and receive data for installation, configuration, customization, patching, reporting purposes and also to maintain licenses.

Additionally, the software can be independent of a server requirement after the initial install for tablet or phone users. This software will manage power on a user's mobile devices via audio voice, visual and animated character alerts. Further, the server solution will interface with any call center software 714 to open tickets or send alerts to pagers automatically when a specific criterion is met on the device, alerting support staff of problems. And, the dashboard display 716 allows for a single dashboard view of all mobile computer carts being managed via this solution, by geographical area. The dashboard display 716 shows each device by its device name with color coded alerts giving support staff a visual of device usage, current battery levels and/or problem devices that need attention.

Figure 8:
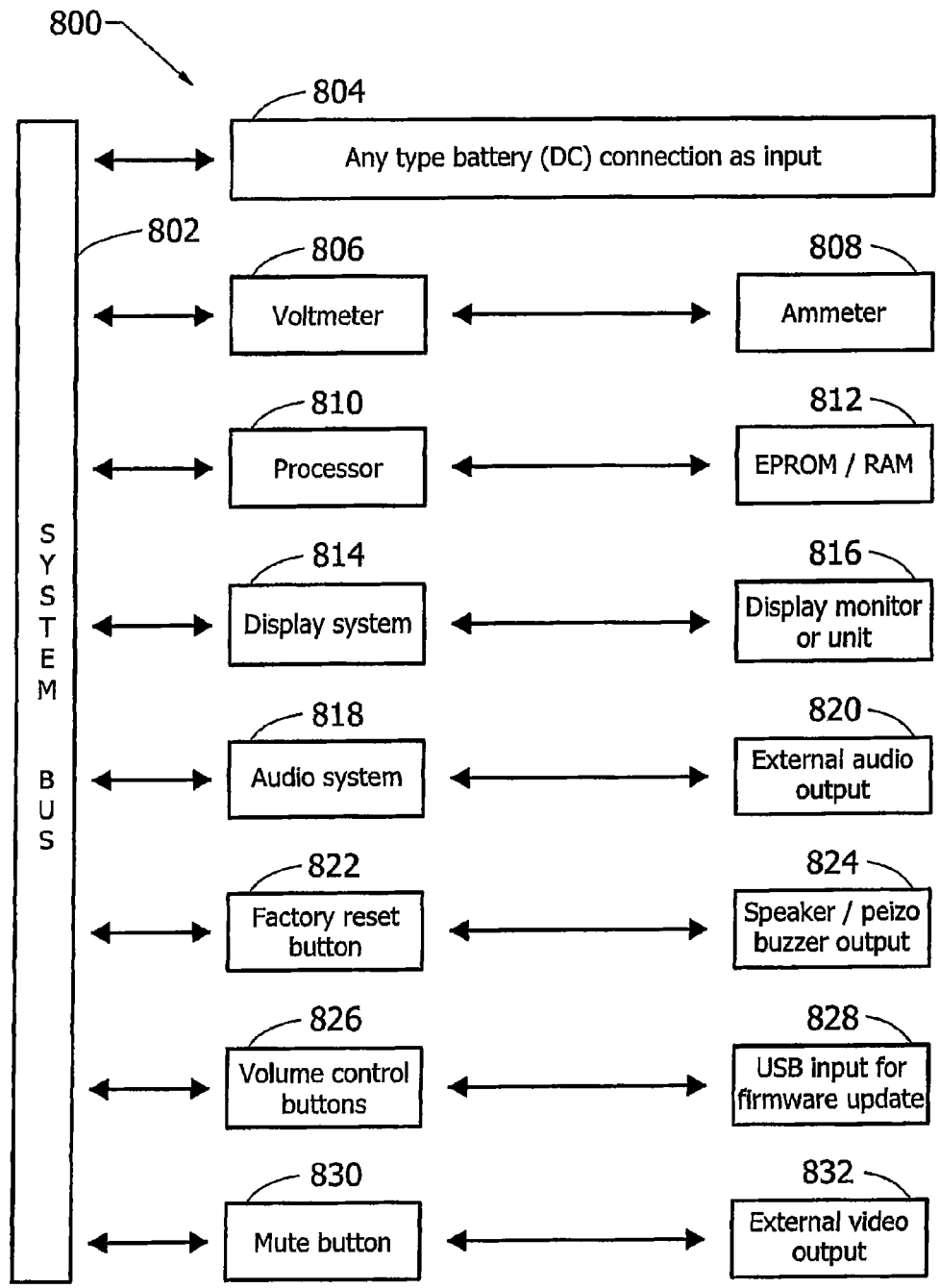
FIG. 8 illustrates a TPMU hardware block diagram of the system for monitoring remaining battery charge levels and detecting when battery charge levels are low in accordance with the disclosed architecture.

FIG. 8 illustrates a TPMU hardware block diagram of the system 800 for monitoring remaining battery charge levels and detecting when battery charge levels are low. The system 800 is the block diagram of the TPMU hardware that is used with mobile computer carts and their respective devices to enable them to receive the battery charge levels and produce alerts. The alerts include, but are not limited to, audio voice, visual and/or animated characters. System bus 802 is the connection wiring between all the hardware components on the system board of the TPMU hardware. All signals, commands, instructions, input and output goes through the system bus 802. At 804, any type of battery (DC) can be connected to the system board via the cables and connectors. The voltmeter 806 is the part of the electronics that measures the voltage in Volts in the battery. This voltage value will be used as a part of input to calculate the remaining battery capacity (RBC). The ammeter 808 is the part of the electronics that measures the current in Amperes in the battery. This current value will be used as a part of the input to calculate the remaining battery capacity (RBC).

Processor 810 is used to calculate the remaining battery charge (RBC) based on the input from the voltmeter 806 and ammeter 808. Processor 810 also performs a variety of functions which include, but are not limited to, executing the program stored in EPROM, taking input from other blocks like USB input, factory reset, volume control, mute buttons, process the input and send commands and output to various blocks like speaker, external audio, display monitor etc. EPROM/RAM 812 (Erasable Programmable Read Only Memory/Random Access Memory) will store the TPMU software application which does the complete monitoring, detection and alerting functionalities. The RAM (Random Access Memory) is used to store the program and intermediate results and provide them to the processor at a faster pace. Display System 814 converts the output from the processor 810 to a format that the video display unit will be able to display properly. Display Monitor/Unit 816 is the physical display unit. It can be an internal or external display depending on the device. It will display the visual messages and/or play animation characters.

Audio System 818 converts the output from the processor 810 to a format that the audio unit will be able to send sound to speakers or a peizo buzzer. External Audio Output 820 sends the alert sounds to external speakers if desired. Factory Reset Button 822, when pressed for 10 seconds, will erase all the custom-made configuration settings and will reset the device to factory defaults. At 824, the audio sound from the audio system 818 is sent out to the attached speaker or peizo buzzer. Volume Control Buttons 826 allow users to increase and decrease volume on the unit. USB input for firmware update port 828, allows the user to download the latest firmware from the Internet to keep the device up-to-date with new features and bug fixes. Mute Button 830 silences the speakers for a specified period of time configurable by the user. External video output 832 displays alerts on an external monitor. The output is via HDMI and DVI.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A computer-implemented method for alerting clinical staff in a hospital environment about a remaining battery charge level on a mobile medical computer cart by monitoring battery charge levels over a period of time via an inverter using a processor coupled to a memory comprising:

monitoring and collecting battery charge level data from the mobile medical computer cart using an inverter, hardware, and a software plugin;

detecting whether battery is weak or strong by analyzing daily battery charging patterns stored in a database over a period of time, using an algorithm;

wherein detecting whether a battery is weak or strong determines at what battery charge threshold level to generate alerts, such that if it is determined that a battery is weak, then the battery charge threshold level is set at a charge level of 50%, and if it is determined that a battery is strong, then the battery charge threshold level is set at a charge level of 40%;

determining a battery charge threshold level to generate alerts by analyzing battery discharge pattern stored in a database over a period of time, using the algorithm; placing the mobile medical computer cart into a detect and protect mode after a predetermined period of time; wherein the detect and protect mode is a hybrid power mode where the battery is trickle drained, such that only a small amount of power is required to keep the mobile medical computer cart in a hybrid state;

detecting real-time utilization of the mobile medical computer cart by tracking keyboard and mouse clicks on the mobile medical computer cart; and triggering voice alerts coupled with visual alerts based on real-time active utilization of the mobile medical computer cart by a user; and wherein the alert is a user customizable computer-generated human voice message which includes visual and animated characters determined by user actions, such that if the mobile medical computer cart is in use by a user, then only the visual and animated characters are played when the alert is triggered, and if the mobile medical computer cart is not in use by a user, then a computer-generated human voice message and the visual and animated characters are played when the alert is triggered; and wherein volume of the alert is automatically adjusted to a lower volume during nights as ambient noise is usually lower and the volume of the alert is then automatically adjusted to a higher volume during daylight hours; and wherein the customizable computer-generated human voice message is customized by a user to various languages, accents, and genders; and wherein if the mobile medical computer cart is not used for a specified period of time, the mobile medical computer cart is automatically put into the detect and protect mode to save battery usage and is brought to fully functional normal operation with a keyboard or mouse click.

2. The computer-implemented method of claim 1, wherein the monitoring and collecting of the battery charge level data from the mobile medical computer cart comprises utilizing hardware to decode signals coming from the battery or inverter to output battery charge level and trigger the alert.

3. The computer-implemented method of claim 1, wherein the collected battery charge level data is stored in a central database on a server in a hospital network with time stamps for future analysis along with battery charge level data collected from all mobile medical computer carts in a hospital network.

4. The computer-implemented method of claim 2, wherein the hardware comprises a microchip programmed with software to monitor and collect the battery charge level data and store in a database for analysis.

5. The computer-implemented method of claim 1, wherein the software plugin interfaces with the inverter to read, understand and convert the battery charge level data to usable form.

6. The computer-implemented method of claim 1, wherein the software plugin is customized to read and understand various data formats produced by different inverter manufacturers.

7. The computer-implemented system of claim 1, wherein reports run by the algorithm are displayed on a dashboard; and wherein the dashboard also displays when batteries need to be replaced under two categories "Replace Soon" and "Replace Now", utilization of the mobile medical computer cart on a graph in three categories "Heavily Used", "Moderately Used" and "Rarely Used", and sends escalation alerts via email or help desk ticket related to hardware failure, battery replacement, low batteries, or no user response for alerts.

8. The computer-implemented method of claim 1, wherein the algorithm analyzes battery data in the database to determine following parameters: change in battery charge percentage in a given time period, battery charge cycles, time taken to fully charge the battery, time period medical mobile computer cart was plugged in for charging, time period of battery discharge, depth of battery discharge, discharge and charge pattern in a day/week/month/year, load on battery, and number of times battery was depleted to a flat battery in a predetermined period of time.

9. The computer-implemented method of claim 8, wherein the parameters determined are used to determine if the battery is a strong or weak battery.

10. The computer-implemented method of claim 8, wherein the parameters determined are used to calculate threshold charge level for the battery to start alerts and to put the mobile medical computer cart into detect and protect mode.

11. The computer-implemented method of claim 1, wherein the detect and protect mode is decided based on how many times the user is alerted and based on battery discharge level.

12. The computer-implemented method of claim 1, wherein the alert is played at a custom volume for different hospital departments and is scheduled to speak or be muted at specific times.

13. The computer-implemented method of claim 1, wherein the alert is automatically muted from a central console for all mobile medical computer carts in a specific area.

14. The computer-implemented method of claim 4, wherein the software interfaces with call center software to automatically open tickets via HL7, SQL and VBScripts and sends escalation emails, text messages, or pager messages.

15. The computer-implemented method of claim 4, wherein the software analyzes the battery charge level data stored in the database over a period of time and predicts expected life of the battery based on a usage pattern.

* * * * *